United States Patent [19]

Misu

[11] Patent Number: 4,727,405
[45] Date of Patent: Feb. 23, 1988

[54] PROTECTIVE NETWORK
[75] Inventor: Kazuhiro Misu, Tokyo, Japan
[73] Assignee: NEC Corporation, Tokyo, Japan
[21] Appl. No.: 935,983
[22] Filed: Nov. 28, 1986
[30] Foreign Application Priority Data Nov. 27, 1985 [JP] Japan ................. 60-267710

[51] Int. Cl.[4] ............... H01L 29/78; H01L 27/04; H01L 29/34
[52] U.S. Cl. .................. 357/23.13; 357/52; 357/48; 357/23.1; 357/68
[58] Field of Search ............. 357/23.13, 52, 48, 23.1, 357/68

[56] References Cited

U.S. PATENT DOCUMENTS 4,688,065 8/1987 Kinoshita et al. ............... 357/23.13

FOREIGN PATENT DOCUMENTS 54-136278 10/1979 Japan .................. 357/23.13
54-159188 12/1979 Japan .................. 357/23.13
57-211273 12/1982 Japan .................. 357/23.13

*Primary Examiner*—Martin H. Edlow
*Assistant Examiner*—D. Featherstone
*Attorney, Agent, or Firm*—Sughrue, Mion, Zinn, Macpeak, and Seas

[57] ABSTRACT

For decreasing a leakage current, there is disclosed a protective network fabricated on a semiconductor substrate for preventing a protected node from a destruction comprising, a semiconductor substrate of a first conductivity type, an insulating film overlying the semiconductor substrate, a first impurity region of a second conductivity type formed in the semiconductor substrate and providing a signal path with a relatively large resistance value electrically connected at a contact portion thereof to the protected node, the signal path having an upstream portion and a downstream portion providing between the contact portion and the upstream side portion, a second impurity region of the second conductivity type formed in the semiconductor substrate and electrically connected to a constant voltage source, a separating region defined in the semiconductor substrate and intervening between a part of the first impurity region and the second impurity region for causing the part of the first impurity region to be spaced apart from the second impurity region, the part of the first impurity region providing a part of the upstream portion and the downstream portion, and an input electrode formed on said insulating film and electrically connected to the upstream portion of the signal path through the insulating film for propagation of an external signal applied thereto, the input electrode extending over a part of the separating region contiguous only to the downstream side portion of the signal path.

3 Claims, 7 Drawing Figures

PROTECTIVE NETWORK

FIELD OF THE INVENTION

This invention relates to a semiconductor device and, more particularly, to an improved protective network incorporated in the semiconductor device for preventing an input transistor from destruction caused by undesired surges.

BACKGROUND OF THE INVENTION

A transistor is designed to be controlled by a relatively small magnitude of voltage but sometimes exposed to undesired high voltage such as, for example, a surge produced from switching operation. This requires a protective network which is expected to decrease the undesired voltage for preventing the transistor from destruction. Many protection networks are evaluated by Jack K. Keller in "PROTECTION OF MOS INTEGRATED CIRCUITS FROM DESTRUCTION BY ELECTROSTATIC DISCHARGE", ELECTRICAL OVERSTRESS/ELECTROSTATIC DISCHARGE SYMPOSIUM PROCEEDINGS 1980, Reliability Analysis Center Sept. 9-11.

Some protective networks are effectively reduced the undesired high voltage and prevents the protected circuits from serious damages. However, when a on-chip protective network is subjected to the undesired high voltage, a high leakage current takes place between the protective network and the semiconductor substrate and deteriorate the power consumption of the protected circuit.

It is therefore a prime object of the present invention to provide an improved protective network which is free from the high leakage current flowing between the protective network and the semiconductor substrate.

SUMMARY OF THE INVENTION

In accordance with the present invention, there is provided a protective network fabricated on a semiconductor substrate for preventing a protected node from a destruction comprising (1) a semiconductor substrate of a first conductivity type, (2) an insulating film overlying the semiconductor substrate, (3) a first impurity region of a second conductivity type formed in the semiconductor substrate and providing a signal path with a relatively large resistance value electrically connected at a contact portion thereof to the protected node, the signal path having an upstream portion and a downstream portion provided between the contact portion and the upstream portion, (4) a second impurity region of the second conductivity type formed in the semiconductor substrate and electrically connected to a constant voltage source, (5) a separating region defined in the semiconductor substrate and intervening between a part of the first impurity region and the second impurity region for causing the part of the first impurity region to be spaced apart from the second impurity region, the part of the first impurity region providing a part of the upstream portion and the downstream portion, and (6) an input electrode formed on the insulating film and electrically connected to the upstream portion of the signal path through the insulating film for propagation of an external signal applied thereto, the input electrode extending over a part of the separating region contiguous only to the downstream portion of the signal path.

BRIEF DESCRIPTION OF THE DRAWINGS

The drawbacks of a prior-art protective network and the features and advantages of a protective network according to the present invention will be more clearly understood from the following description taken in conjunction with the accompanying drawings in which like reference numerals designate similar or corresponding regions and elements and in which.

DESCRIPTION OF THE PRIOR-ART

Figure 1:
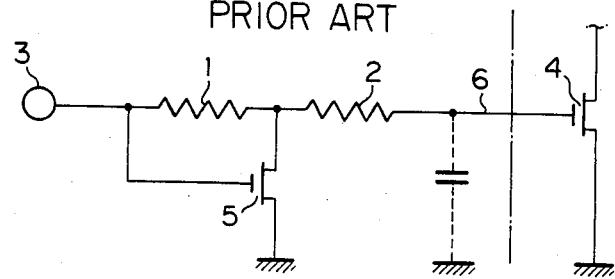
FIG. 1 is a circuit diagram showing the circuit arrangement of a representative example of a prior-art protective network.

A known protective network is illustrated in FIG. 1 of the drawings and comprises a series of resistors 1 and 2 provided between an input electrode 3 and a gate of an input MOS transistor 4, and a MOS transistor 5 provided between the intermediate node of the series of the resistors 1 and 2 and the ground. The MOS transistor 5 has a gate electrode electrically connected to the input electrode 3. The resistor 1 has relatively large resistance value, and the resistor 2 and a signal path 6 with a certain parasitic capacitance provide a preselected time constant.

Figure 2:
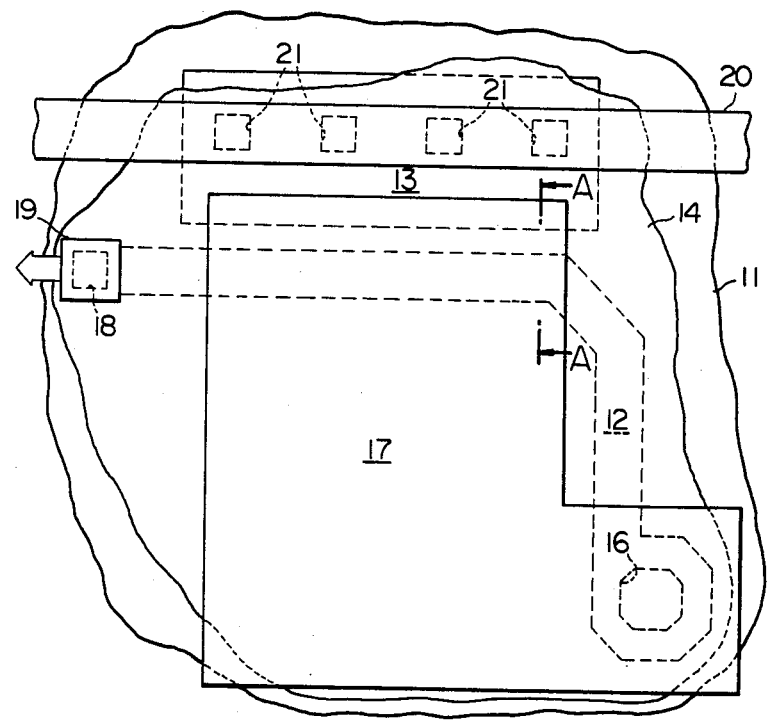
FIG. 2 is a partially cut-away plan view showing the structure of the prior-art protective network of FIG. 1 implemented on a semiconductor substrate.
Figure 3:
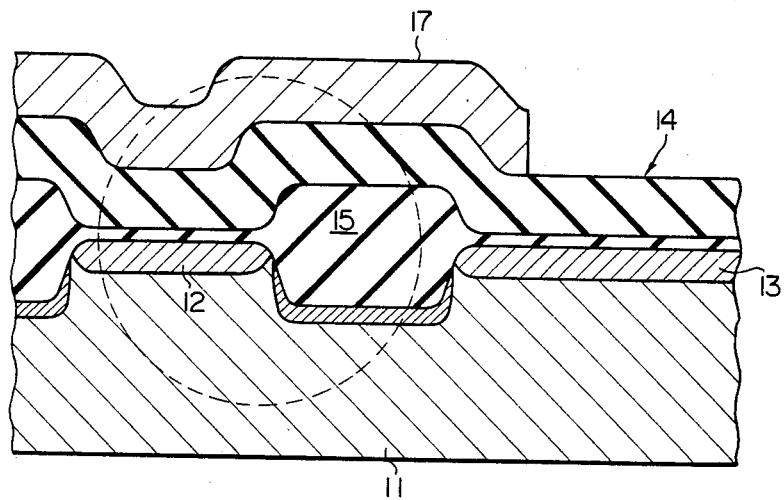
FIG. 3 is a cross sectional view taken along the line A—A of FIG. 2, and showing a part of the prior-art protective network.

Turning to FIGS. 2 and 3, there is shown the known protective network fabricated on a p-type semiconductor substrate 11. In the semiconductor substrate 11 is formed an n-type first doped region 12 extending in bent form and providing the series of the resistors 1 and 2 in FIG. 1. The semiconductor substrate 11 further has an n-type second doped region 13 spaced apart from a downstream side portion of the first doped region 12 by a narrow gap. The second doped region 13 provides the source of the MOS transistor 5, and, on the other hand, the downstream side portion of the first doped region 12 provides the drain of the MOS transistor 5.

The p-type semiconductor substrate 11 is covered with an insulating film structure 14 which provides a field oxide 15 on the narrow gap between the first and second doped regions 12 and 13. In the insulating film structure 14 is formed a contact hole 16 through which an input metal pad 17 of aluminum passes and contacts with an upstream side portion of the first doped region 12. A contact hole 18 is further formed in the insulating film structure 14 and filled with a metal wiring layer 19 which is connected at one end thereof to the down stream side of the first doped region 12 and provides at the other end thereof the gate electrode of the MOS transistor 4 shown in FIG. 1. The second doped region 13 is connected to another wiring metal layer 20 through a plurality of contact holes 21 and supplied with the ground voltage level through the wiring metal layer 20. The input metal pad 17 extends on the insulating film structure 14 over the whole narrow gap between the first and second doped regions and provides the gate of the MOS transistor 5.

Though not shown in the drawings, the input metal pad 17 is connected to a bonding wire which supplies the input metal pad 17 with an external signal. Upon application of the external signal, the first doped region 12 propagates the external signal to the metal wiring layer 19, but the level of the external signal does not exceed the threshold voltage of the MOS transistor 5. Thus, the external signal can reach the gate of the input transistor 4 in the normal operation.

When a surge with excess high voltage level takes place, the voltage levels of the surge decrease during propagation along the first doped region 12. In addition to this, the first doped region 12 provides a preselected time constant based on the resistance thereof and a parasitic capacitance produced between the semiconductor substrate 11 and the first doped region 12, so that the surge should experience a substantial time delay during the propagation thereof. Prior to reaching the gate of the input MOS transistor 4, the MOS transistor 5 changes the state to discharge the surge current to the ground, and, for this reason, the protective network does not allow the excess high voltage levels of the surge to destroy the input MOS transistor 4.

Figure 4:
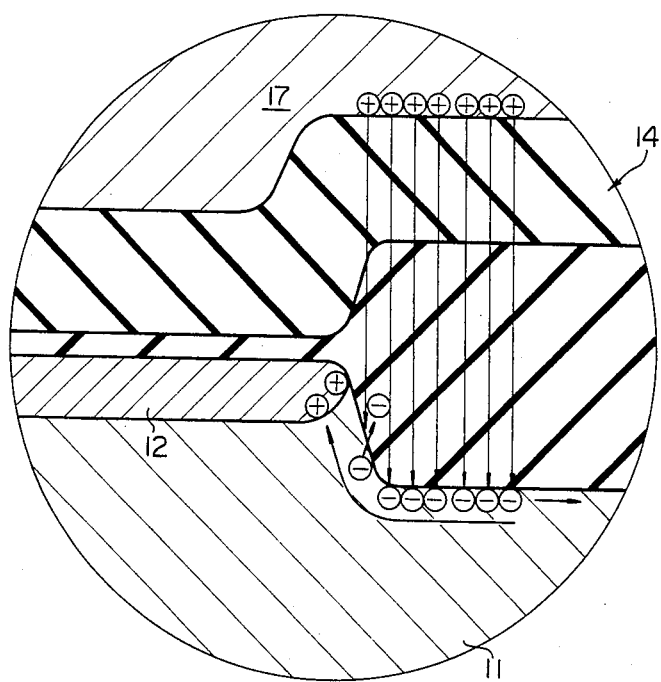
FIGS. 4 and 5 are cross sectional views each showing, to an enlarged scale, a portion of the prior-art protective network encircled by a dotted line in FIG. 3.

However, a drawback is encountered in the prior-art protective network in that a high leakage current takes place between the first doped region 12 and the semiconductor substrate 11 even if no surge appears. A detailed description is made with reference to FIGS. 4 and 5.

Figure 5:
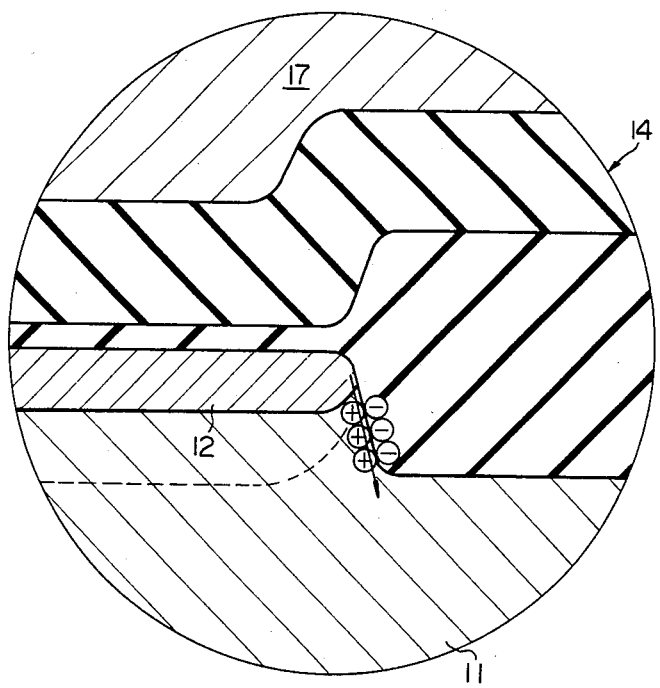

When positive excess voltage levels of a surge is applied to the input electrode 17, electrons are induced along the boundary between the semiconductor substrate 11 and the insulating film structure 14. The conduction electrons provide the channel between the first and second doped regions 12 and 13 and allow electrons to flow from the second doped region 13 to the first doped region 12 by the agency of electric field produced by the positive potential of the first doped region 12. The electrons obtain the highest energy level in the vicinity of the first doped region 12 and become hot electrons which are attracted toward the first doped region 12. However, some of the hot electrons are scattered and reach the boundary between the p-type semiconductor substrate 11 and the insulating film structure 14 serving as the gate oxide of the MOS transistor 5. If the hot electrons have an energy level sufficient to exceed the barrier of the gate oxide to electrons, the hot electrons are trapped in the gate oxide as will be seen from FIG. 4. With the electrons thus trapped in the gate oxide of the MOS transistor 5, positive charges are induced in the surface portion of p-type semiconductor substrate 11 as shown in FIG. 5.

In this circumstance, when the external signal is applied to the input metal pad 17, the first doped region 12 is reverse-biased, and a depletion region 22 is established and extends in the semiconductor substrate 11. However, the depletion region 22 is reduced in thickness in the surface portion of the semiconductor substrate 11 where the positive charges are induced by the virtue of the trapped electrons. Breakdowns tend to take place across the reduced depletion layer and cause the leakage current between the first doped region 12 and the semiconductor substrate 11 to be increased.

DETAILED DESCRIPTION OF THE EMBODIMENT

Figure 6:
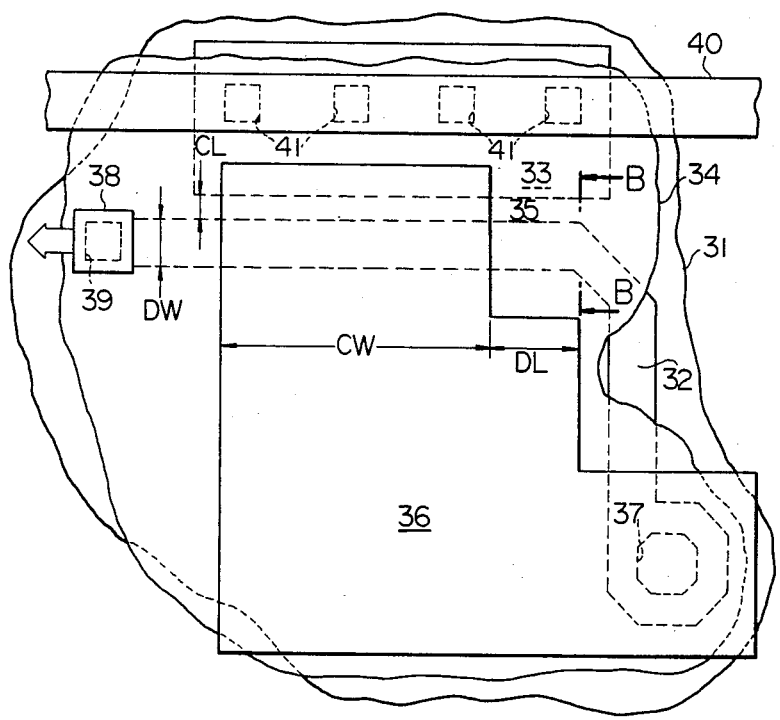
FIG. 6 is a partially cut-away plan view showing the structure of a preferred embodiment of a protective network according to the present invention.
Figure 7:
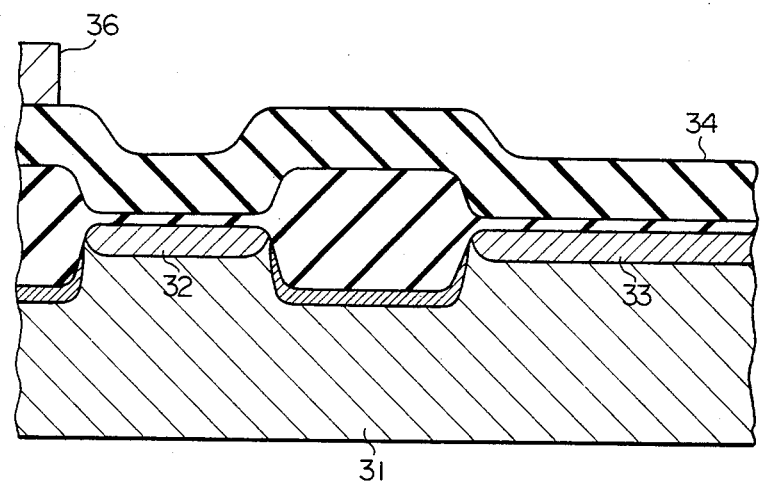
FIG. 7 is a cross sectional view taken along the line B—B of FIG. 6, and showing a part of the preferred embodiment of the protective network.

Referring to FIG. 6 of the drawings, there is shown a protective network embodying the present invention. The protective network comprises a series of resistors and a MOS transistor and is implemented on a p-type semiconductor substrate 31. Namely, the p-type semiconductor substrate 31 has first and second n-type impurity regions 32 and 33 and is covered with an insulating film structure 34. The first impurity region 32 extends in bent form and provides a signal path with a relatively large resistance value more than 1 kilo-ohms, typically 2 kilo-ohms, where serves as the series of the resistors. In this instance, the first impurity region 32 has a width of about 10 microns and a length of 100 microns to 200 microns.

The signal path in the first impurity region 32 comprises an upstream portion and a downstream portion which are merged with each other. The second impurity region 33 is opposite to a part of the first impurity region providing a part of the upstream portion and the down stream portion, and a narrow gap 35 is interposed therebetween. The upstream portion in the first impurity region 32 is connected to an input metal pad 36 of aluminum through a contact opening 37 formed in the insulating film structure 34. The first impurity region 32 is further connected at a contact portion thereof to a metal wiring layer 38 of aluminum through a contact opening 39 formed in the insulating film structure 34. Though not shown in the drawings, the metal wiring layer 38 provides a gate electrode of an input transistor and serves as a protected node. The second impurity region 33 is also connected to a metal wiring layer 40 of aluminum through a plurality of contact openings 41 and supplied with the ground voltage level. The input metal pad 36 extends over the downstream portion of the first impurity region 32 and a part of the narrow gap 35 contiguous to a part of the first impurity region 32 providing the downstream portion of the signal path. The input metal pad 36 thus arranged provides a gate electrode of a MOS (metal-oxide-semiconductor) transistor which has source/drain regions formed by the impurity region 33 and the downstream portion of the impurity region. The MOS transistor has a channel width CW of about 100 microns and a channel length CL of about 5 microns to 6 microns. The upper end portion of the right edge of the input metal pad 36 is removed over a distance DL of about 20 microns to expose the insulating film structure 34 overlying the upperstream portion of the signal path. It is desirable that the distance DL of the upperstream portion extending in parallel to the second impurity region 33 is more than 5 microns, preferably than 10 microns. However, the uppermost value of the distance DL is not limited. If the distance DL is selected to have a value more than the above mentioned value, no problem is encountered, because the first impurity region only serves as the resistor.

Upon application of surge, electrons are induced in the surface portion of the semiconductor substrate 31 by the agency of electric field produced by the positive potential on the input metal pad 36 and may be trapped in the insulating film structure 34 underneath the input metal pad 36. In this circumstance, if an external signal is applied to the input metal pad 36, no breakdown takes place in the narrow gap 35 between the downstream portion of the first impurity region 32 and the semiconductor substrate 31, because the external signal is subjected to a substantial resistance during propagation along the signal path. In other words, the magnitude of the voltage level in the downstream portion is less than that in the upstream portion, and the breakdown field does not applied to the depletion layer extending from the boundary between the downstream portion and the semiconductor substrate 31 even if the electrons are trapped in the insulating film structure 34 underneath the input metal pad 36.

As to the upstream portion opposing to the second impurity region 33, a relatively high voltage level appears in comparison with the downstream portion, but no breakdown takes place, because the depletion layer sufficiently extends in the semiconductor substrate 31 without influences of trapped electrons.

As will be understood from the foregoing description, the protective network according to the present invention is free from the breakdown which is causative of high leakage current flowing from the first impurity region to the semiconductor substrate.

The protective network described above is implemented on the p-type semiconductor substrate, but it will be obvious to those skilled in the art that various changes and modifications including a protective network fabricated on an n-type semiconductor substrate may be made without departing from the spirit and scope of the present invention.

What is claimed is:

1. A protective network fabricated on a semiconductor substrate for preventing a protected node from a destruction comprising,
   (1) a semiconductor substrate of a first conductivity type,
   (2) an insulating film overlying said semiconductor substrate,
   (3) a first impurity region of a second conductivity type formed in said semiconductor substrate and providing a signal path with a relatively large resistance value electrically connected at a contact portion thereof to said protected node, said signal path having an upstream portion and a downstream portion provided between said contact portion and the upstream portion,
   (4) a second impurity region of the second conductivity type formed in said semiconductor substrate and electrically connected to a constant voltage source,
   (5) a separating region defined in said semiconductor substrate and intervening between a part of said first impurity region and said second impurity region for causing the part of the first impurity region to be spaced apart from the second impurity region, said part of the first impurity region providing a part of said upstream portion and said downstream portion, and
   (6) an input electrode formed on said insulating film and electrically connected to the upstream portion of said signal path through the insulating film for propagation of an external signal applied thereto, said input electrode extending over a part of said separating region contiguous only to said downstream portion of said signal path.

2. A protective network as set forth in claim 1, in which said semiconductor substrate is of a p-type material, and in which each of said first and second impurity regions is of an n-type material.

3. A protective network as set forth in claim 2, in which said second impurity region is electrically connected to the ground.

* * * * *